(12) United States Patent
Mathew et al.

(10) Patent No.: US 7,112,455 B2
(45) Date of Patent: Sep. 26, 2006

(54) SEMICONDUCTOR OPTICAL DEVICES AND METHOD FOR FORMING

(75) Inventors: Leo Mathew, Austin, TX (US); Yang Du, Austin, TX (US); Voon-Yew Thean, Austin, TX (US)

(73) Assignee: Freescale Semiconductor, INC, Austin, TX (US)

( * ) Notice: Subject to any disclaimer, the term of this patent is extended or adjusted under 35 U.S.C. 154(b) by 8 days.

(21) Appl. No.: 10/865,451

(22) Filed: Jun. 10, 2004

(65) Prior Publication Data

US 2005/0277211 A1    Dec. 15, 2005

(51) Int. Cl.
*H01L 21/00* (2006.01)

(52) U.S. Cl. .......................... 438/22; 977/950
(58) Field of Classification Search ............ None
See application file for complete search history.

(56) References Cited

U.S. PATENT DOCUMENTS

| | | | |
|---|---|---|---|
| 5,726,464 A * | 3/1998 | Kumomi et al. | 257/103 |
| 6,107,125 A * | 8/2000 | Jaso et al. | 438/149 |
| 2003/0127659 A1 | 7/2003 | Bawendi et al. | |
| 2004/0104668 A1* | 6/2004 | Lee et al. | 313/496 |
| 2004/0159910 A1* | 8/2004 | Fried et al. | 257/536 |

FOREIGN PATENT DOCUMENTS

EP    0 544 408 A3    6/1993

OTHER PUBLICATIONS

Malinin et al., Reports in Electron Physics, 2001.*
Ng Kwok, Complete Guide to Semiconductor Devicies, 2002, John Wiley & Sons Inc. Second edition, 431-437.*
Fauchet, Phillippe M. et al.; "Progress Toward Nanoscale Silicon Light Emitters"; IEEE Journal of Selected Topics in Quantum Electronics; Nov./Dec. 1998; pp. 1020-1028; vol. 4, No. 6; IEEE.

* cited by examiner

*Primary Examiner*—B. William Baumeister
*Assistant Examiner*—Matthew Reames
(74) *Attorney, Agent, or Firm*—Joanna G. Chiu; Daniel D. Hill; Robert L. King

(57) ABSTRACT

A semiconductor optical device includes an insulating layer, a photoelectric region formed on the insulating layer, a first electrode having a first conductivity type formed on the insulating layer and contacting a first side of the photoelectric region, and a second electrode having a second conductivity type formed on the insulating layer and contacting a second side of the photoelectric region. The photoelectric region may include nanoclusters or porous silicon such that the device operates as a light emitting device. Alternatively, the photoelectric region may include an intrinsic semiconductor material such that the device operates as a light sensing device. The semiconductor optical device may be further characterized as a vertical optical device. In one embodiment, different types of optical devices, including light emitting and light sensing devices, may be integrated together. The optical devices may also be integrated with other types of semiconductor devices, such as vertical field-effect transistors.

13 Claims, 17 Drawing Sheets

SEMICONDUCTOR OPTICAL DEVICES AND METHOD FOR FORMING

FIELD OF THE INVENTION

This invention relates generally to semiconductor optical devices, and more specifically, to vertically integrated semiconductor optical devices.

RELATED ART

Semiconductor optical devices may include light emitting diodes (LEDs), lasers, photo sensors, electroluminescent displays. One method known today for forming such devices is through the use of Gallium Arsenide (GaAs) or Cadmium Selenide (CdSe). However, these materials are not compatible with silicon CMOS processing, which prevents the ability to effectively integrate them with other silicon-based devices.

Another known method used today, use semiconductor structures, such as silicon structure, which are planar where the contacts are on the top and bottom of the device. Thus, these type of planar structures occupy large areas of silicon on a wafer. For example, FIG. 1 illustrates in schematic form, a cross section of a prior art optical device 8. Optical device 8 includes a semiconductor p+ region 6, a semiconductor intrinsic region 4, and a semiconductor n+ region 2, where typically, p+ region 6 is located at a top surface of a semiconductor wafer and n+ region 2 is located at a bottom surface of a wafer. Note that based on the materials chosen for semiconductor intrinsic region 4, device 8 may operate as an LED or a photo sensor. For example, in the case of an LED, intrinsic region 4 may be formed of porous silicon or discrete silicon nanoclusters. However, although device 8 may be formed using silicon, the sidewalls of device 8 are not used for emitting or detecting light or injecting holes and electrons. Therefore, device 8 does not effectively use the available dimensions. Furthermore, if planar contacts are needed, extra area is needed to route a contact to the n+ region or p+ region to the opposite side of the wafer. Therefore, a need exists for improved semiconductor optical devices which may make use of sidewall regions and which may be integrated with other types of semiconductor devices.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

One embodiment of the present invention relates to an improved optical semiconductor device or element which may be integrated with other types of optical semiconductor devices or elements or other types of semiconductor devices or elements. In one embodiment, nanoclusters are used within a photoelectric region of a vertical optical device, where the sides of the photoelectric region are in contact with conductive electrodes of different conductivity types which allow for the emitting of light. For example, these devices may include LEDs or lasers. In another embodiment, an intrinsic semiconductor material is used within a photoelectric region of a vertical optical device, where the sides of the photoelectric region are in contact with conductive electrodes of different conductivity types which allow for the detecting of light. For example, these devices may include photo detectors or sensors. Also, as used herein, vertical optical devices are devices having conductive electrodes of different conductivity types formed along and in contact with opposite sides of a photoelectric region, in which the conductive electrodes and photoelectric region overlie an insulating layer.

Figure 1:
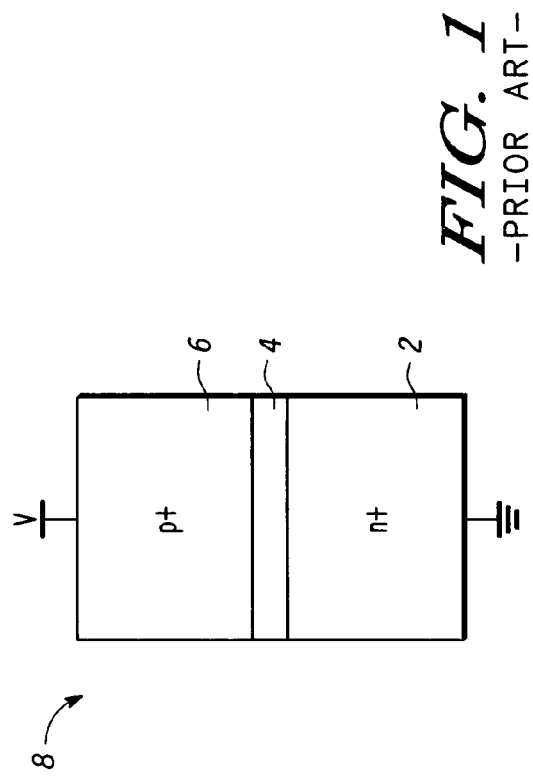
FIG. 1 illustrates a prior art optical device.
Figure 2:
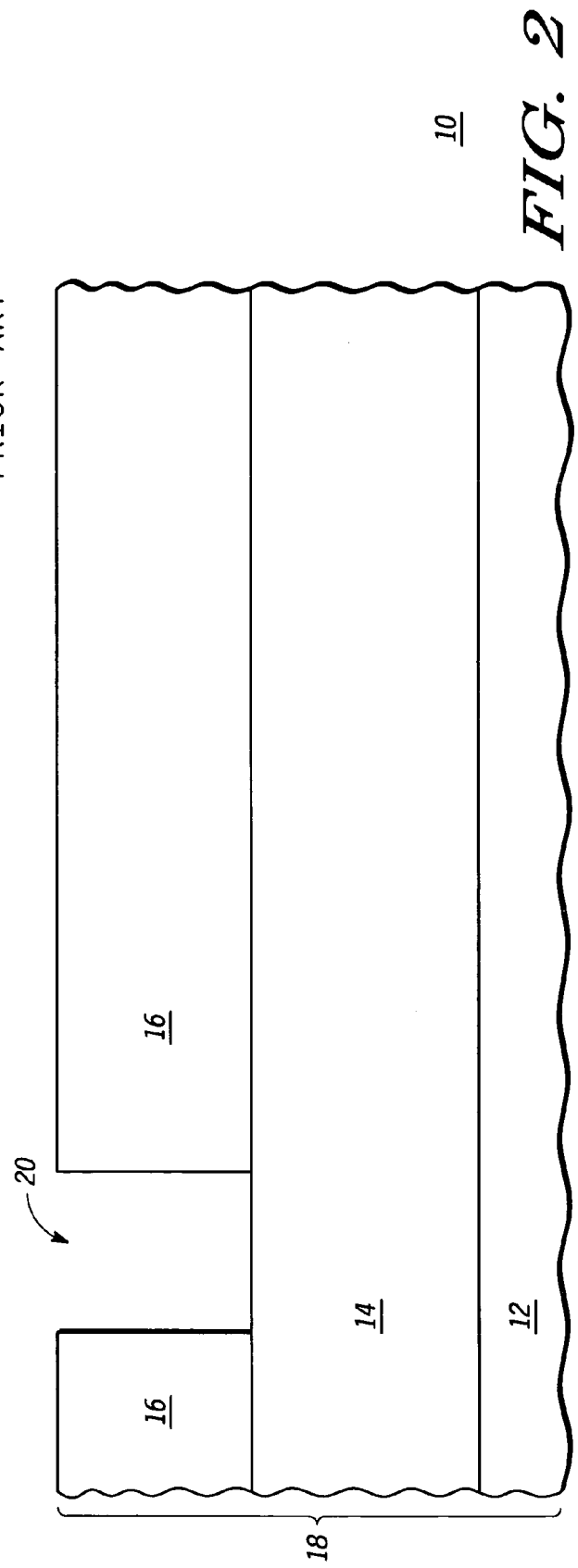
FIG. 2 illustrates a semiconductor device having an opening, in accordance with one embodiment of the present invention.

FIG. 2 illustrates a semiconductor device 10 having a semiconductor wafer 18 which has an opening 20 etched within a top layer, in accordance with one embodiment of the present invention. In the illustrated embodiments, semiconductor wafer 18 is a semiconductor on insulator (SOI) wafer having a substrate 12, a dielectric layer 14 overlying substrate 12, and a semiconductor layer 16 overlying dielectric layer 14. In the illustrated embodiment, opening 20 is formed using conventional masking and etching techniques to expose underlying dielectric layer 14. (Note that the shape of opening 20 may be adjusted as desired to create inclined sidewalls which may allow for varying light emitting characteristics of the resulting fin.) Substrate 12 may be any type of material which provides mechanical support to overlying layers. For example, in one embodiment, substrate 12 may be any semiconductor material such as silicon, gallium arsenide, silicon germanium etc., or any insulating material such as glass or sapphire. Dielectric layer 14 may be any type of insulating material, such as, for example, oxide, nitride, glass, sapphire, etc. If dielectric layer 14 is of sufficient strength to provide mechanical support to overlying layers, substrate 12 may not be present. For example, dielectric layer 14 may be formed of glass, and thus able to provide support for overlying layers without the need for substrate 12.

Figure 3:
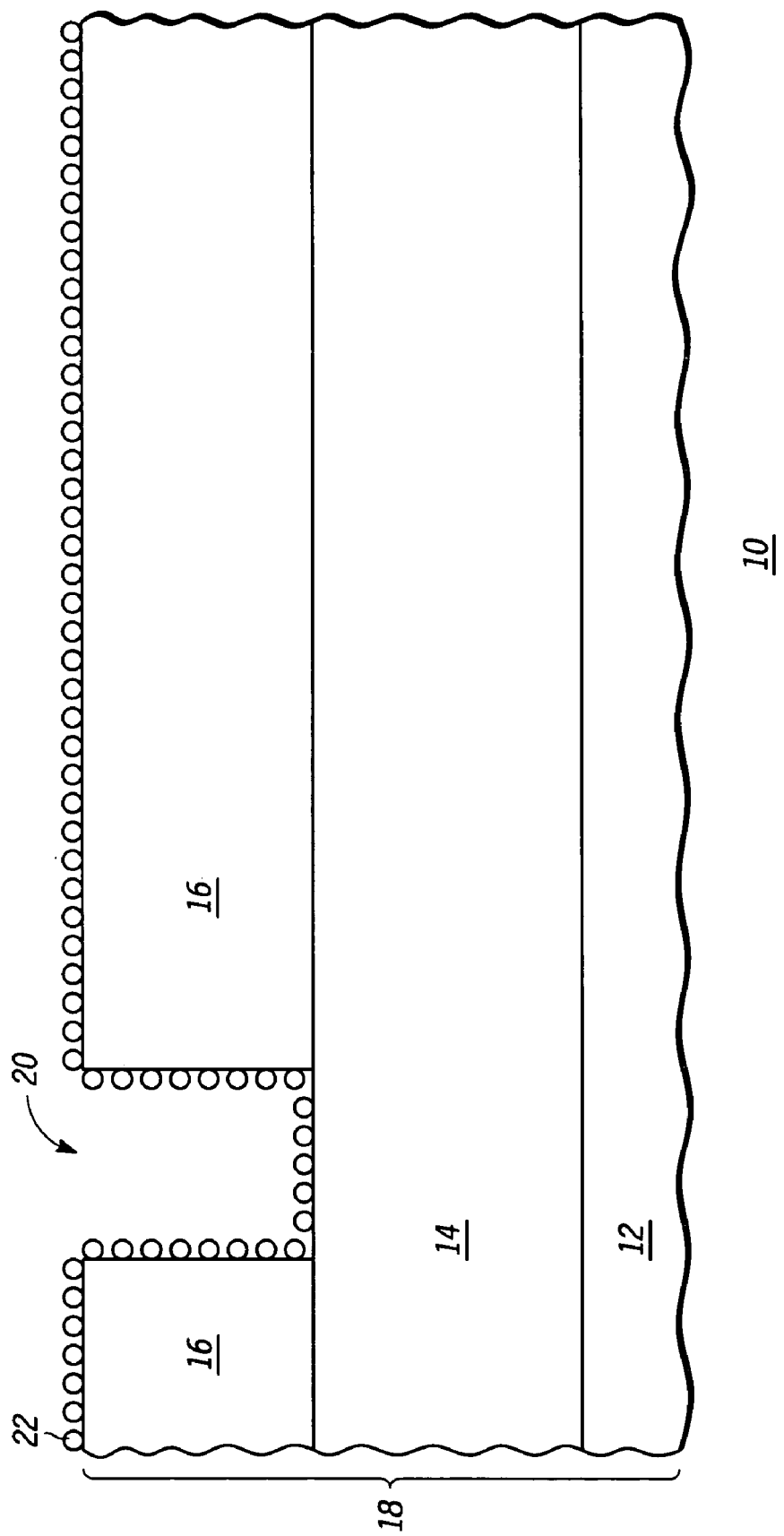
FIG. 3 illustrates the semiconductor device of FIG. 2 after formation of a layer of nanoclusters, in accordance with one embodiment of the present invention.

FIG. 3 illustrates semiconductor device 10 of FIG. 2 after formation of nanoclusters 22 overlying semiconductor layer 16 and within opening 20. Nanoclusters 22 are embedded within a dielectric layer (not numbered). In one embodiment, nanoclusters 22 are formed by thermal nucleation of silicon on an oxide surface. Alternatively, other materials such as cadmium selenide, zinc sulfide, and other photo active materials may be used for nanoclusters 22. The dielectric layer may be any type of insulating material, such as, for example, an oxide.

Figure 4:
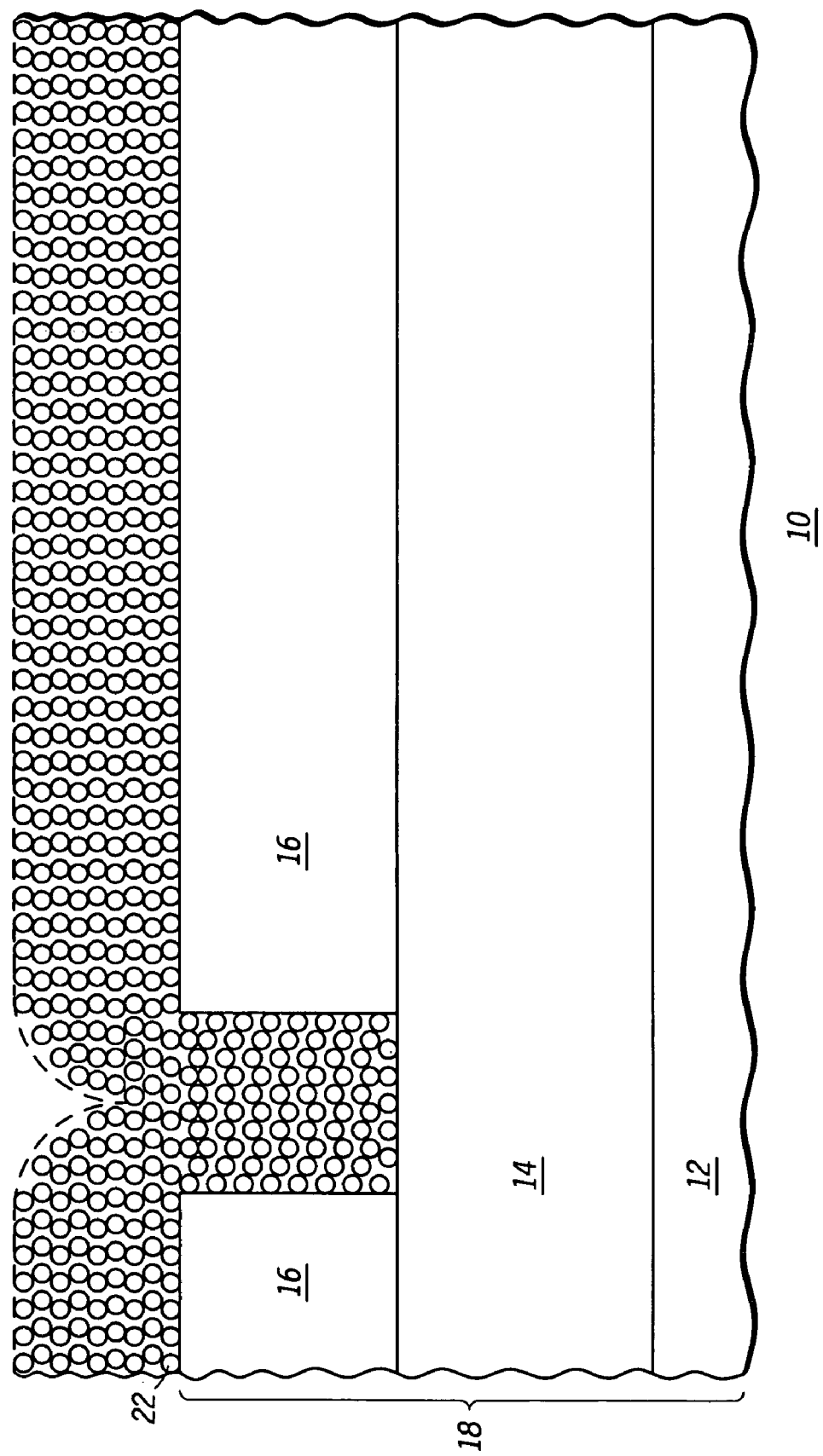
FIG. 4 illustrates the semiconductor device of FIG. 3 after formation of multiple layers of nanoclusters, in accordance with one embodiment of the present invention.

FIG. 4 illustrates semiconductor device 10 of FIG. 3 after the formation of multiple layers of nanoclusters, where each layer may be formed, for example, by thermal nucleation of silicon on a subsequent oxide surface. Therefore, the dielectric layer between nanoclusters 22 may be formed of oxide and controlled by the thermal oxidation. In one embodiment, the size and density of nanoclusters 22 may be different in different regions, and may be controlled by the thermal conditions during and after formation of the nanoclusters. For example, different layers may include different size and/or different densities of nanoclusters. The formation of different size nanoclusters may allow for the generation of different light wavelengths. Also, each of nanoclusters 22 may vary in size and shape. For example, some nanoclusters may be round, while others may be oval or bone-shaped. In the illustrated embodiments, sufficient layers of nanoclusters are formed in order to fill opening 20. In one embodiment, elements such as, for example, erbium may be incorporated into the nanoclusters to increase the light emitting efficiency.

In an alternate embodiment, a layer of porous silicon may be formed overlying semiconductor layer 16 and filling opening 20. In this embodiment, a deposited silicon layer may be etched to form porous silicon. Alternatively, other porous semiconductor materials may be used, such as, for example, silicon germanium.

In yet another alternate embodiment, opening 20 may not be formed within semiconductor layer 16. In this alternate embodiment, nanocluscers 22 and the surrounding dielectric layer may be formed overlying semiconductor layer 16. Also, sufficient layers of nanoclusters 22 may be formed until a desired height is achieved to form the LED.

Figure 5:
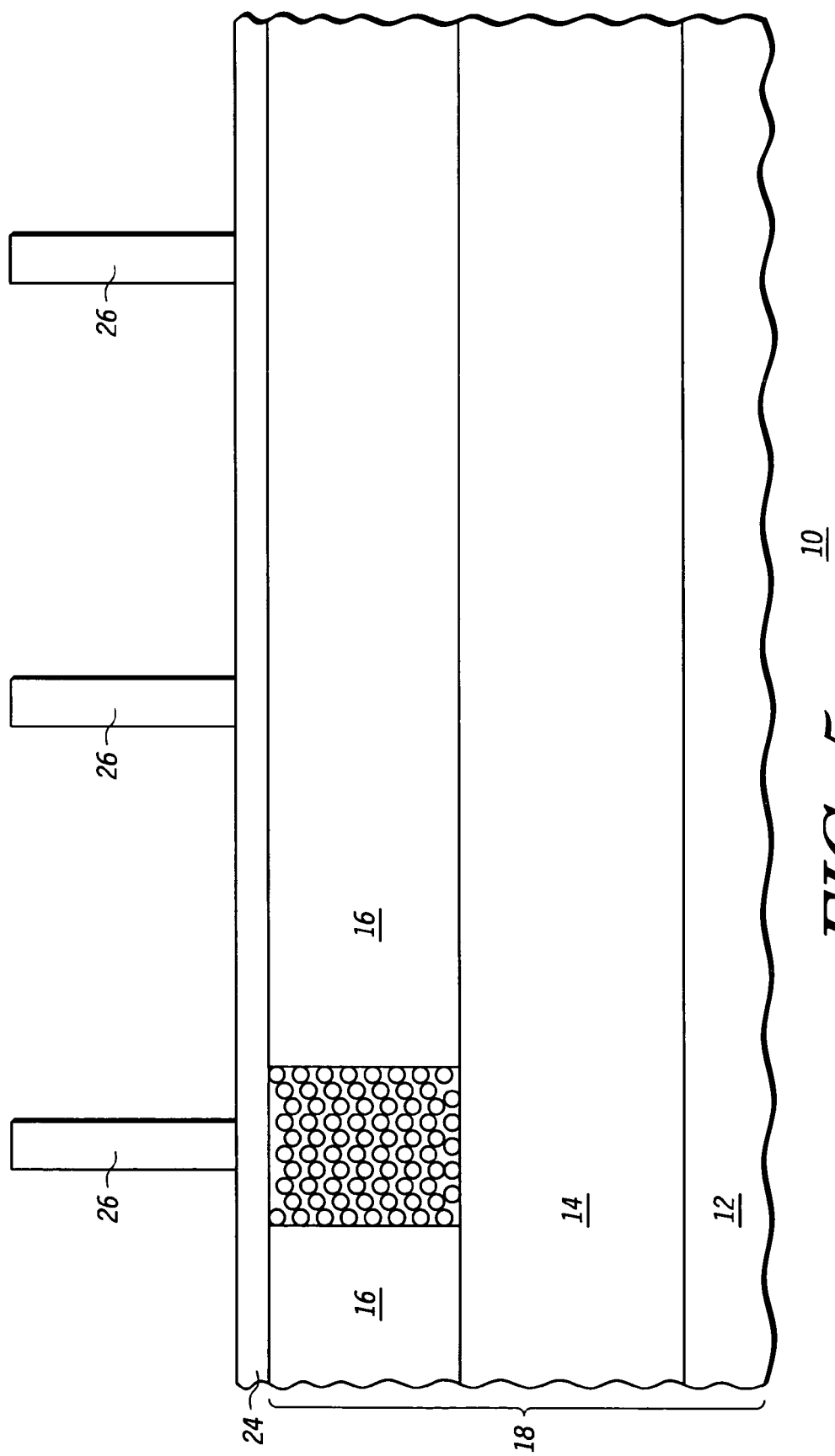
FIG. 5 illustrates the semiconductor device of FIG. 4 after formation of an optional dielectric layer and a patterned masking layer, in accordance with one embodiment of the present invention.

FIG. 5 illustrates semiconductor device 10 after planarization to remove the nanoclusters 22 and the surrounding dielectric layer overlying semiconductor layer 16. Therefore, only the portion of nanoclusters 22 and the associated dielectric layer within opening 20 remain. After planarization, a dielectric layer 24 is formed overlying semiconductor layer 16 and nanoclusters 22. In one embodiment, dielectric layer 24 may be a nitride or an oxide layer, or a combination thereof. Alternatively, dielectric layer 24 may not be present. A patterned masking layer 26 is formed over dielectric layer 24 to define fins for the formation of vertical optical and semiconductor devices, in one embodiment, patterned masking layer 26 is a photo resist layer where conventional masking and patterning techniques may be used.

Figure 6:
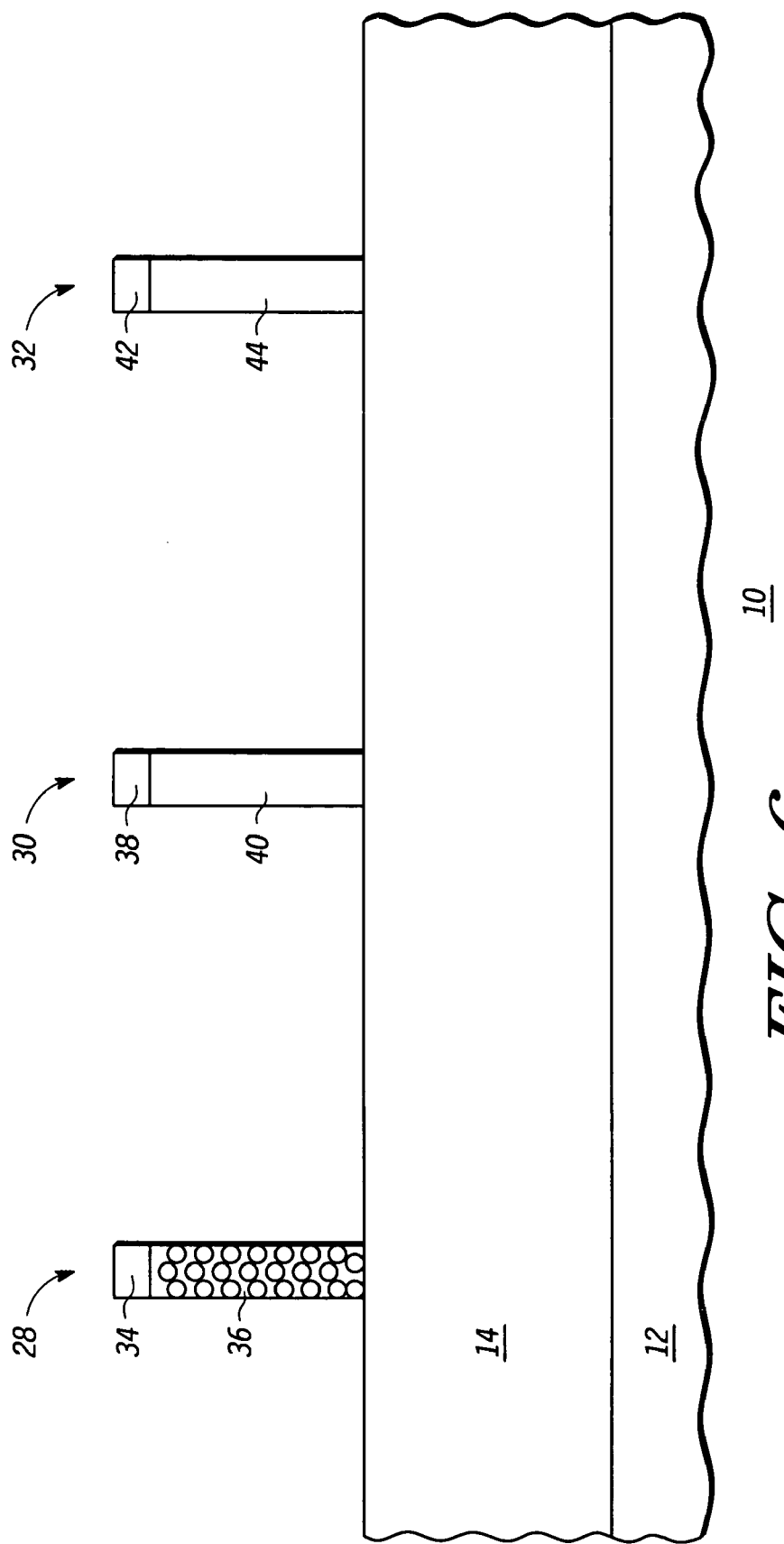
FIG. 6 illustrates the semiconductor device of FIG. 5 after formation of fins, in accordance with one embodiment of the present invention.

FIG. 6 illustrates semiconductor device 10 after formation of fins 28, 30, and 32. Fin 28, having nanocluster portion 36 and overlying dielectric portion 34, will be used in the formation of a light emitting element (such as, for example, an LED or a laser). Fin 30, having an intrinsic semiconductor portion 40 and overlying dielectric portion 38, will be used in the formation of a light detecting element (such as, for example, a photo sensor). Therefore, note that each of 36 and 40 may be referred to as photoelectric regions. These photoelectric regions will operate to emit or detect light or photons, as will be described below. Note that the photoelectric regions may or may not include overlying dielectric portions such as portions 34 and 38. Fin 32, having semiconductor portion 44 (which may be subsequently doped) and overlying dielectric portion 42, will be used in the formation of a vertical metal-oxynitride field effect transistor (MOSFET). Note that each of fins 28, 30, and 32 may not include a dielectric portion such as dielectric portion 34, 38, and 42.

Figure 7:
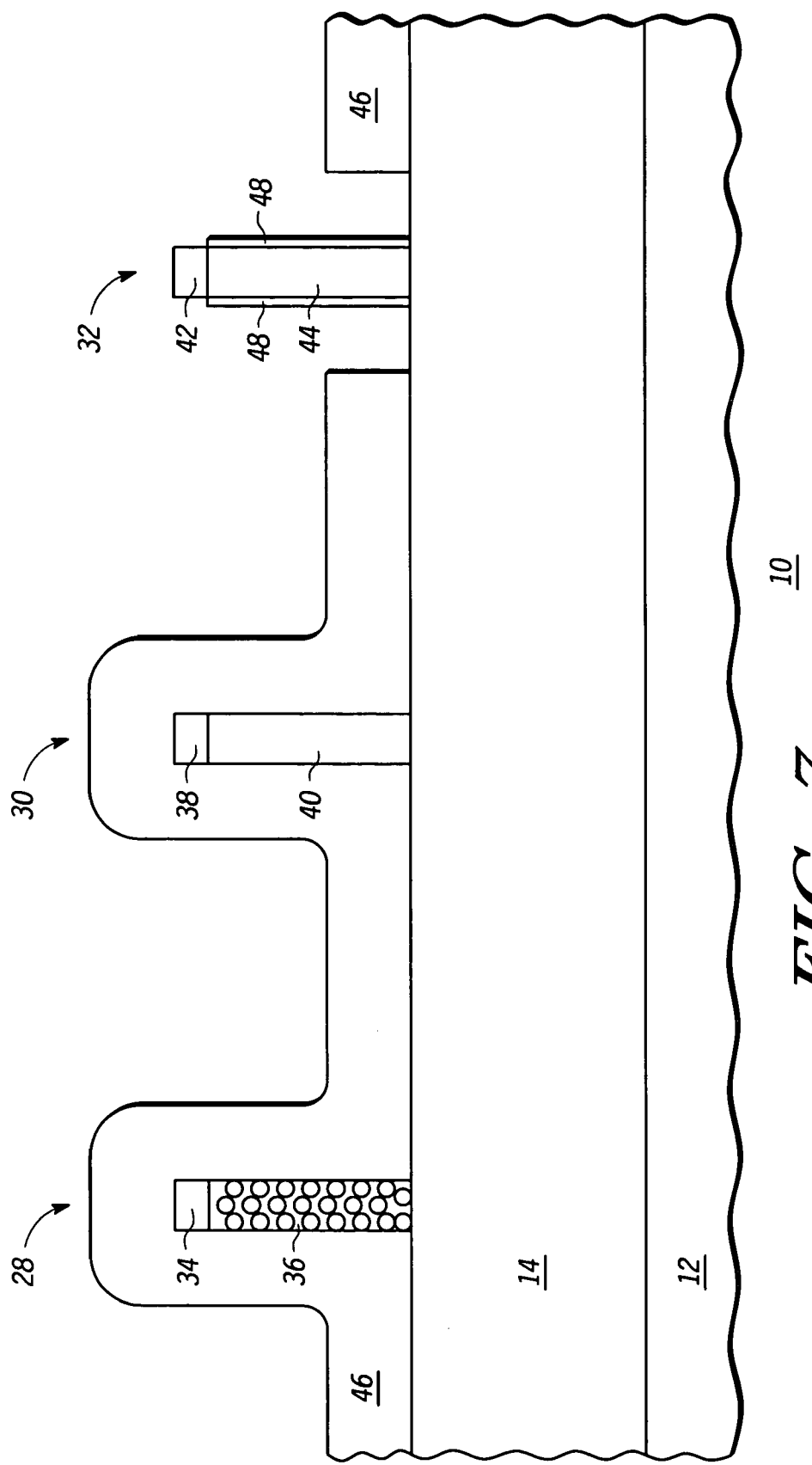
FIG. 7 illustrates the semiconductor device of FIG. 6 after formation of a patterned masking layer, in accordance with one embodiment of the present invention.

FIG. 7 illustrates semiconductor device 10 of FIG. 6 after formation of a patterned masking layer 46 which masks fins 28 and 30 while exposing fin 32. In one embodiment, patterned masking layer 46 is a nitride or an oxide layer. Conventional deposition and patterning techniques may be used to form patterned masking layer 46. After formation of patterned masking layer 46, an implant may be performed into semiconductor portion 44. For example, in one embodiment, boron is implanted for an n-type (i.e. NMOS) device and arsenic for a p-type (i.e. PMOS) device. Alternatively, semiconductor portion 44 may be left undoped. After doping (if performed), dielectric regions 48 are formed along the sides of semiconductor portion 44. In one embodiment, a thermal oxidation is used to form dielectric regions 48. Alternatively, a high dielectric constant (K) material is deposited over and along the sides of fin 32. Therefore, note that in the illustrated embodiment fin 40 remains as an intrinsic semiconductor portion. After formation of dielectric regions 48, patterned masking layer 46 may be removed, using, for example, a conventional wet or dry etch technique.

Figure 8:
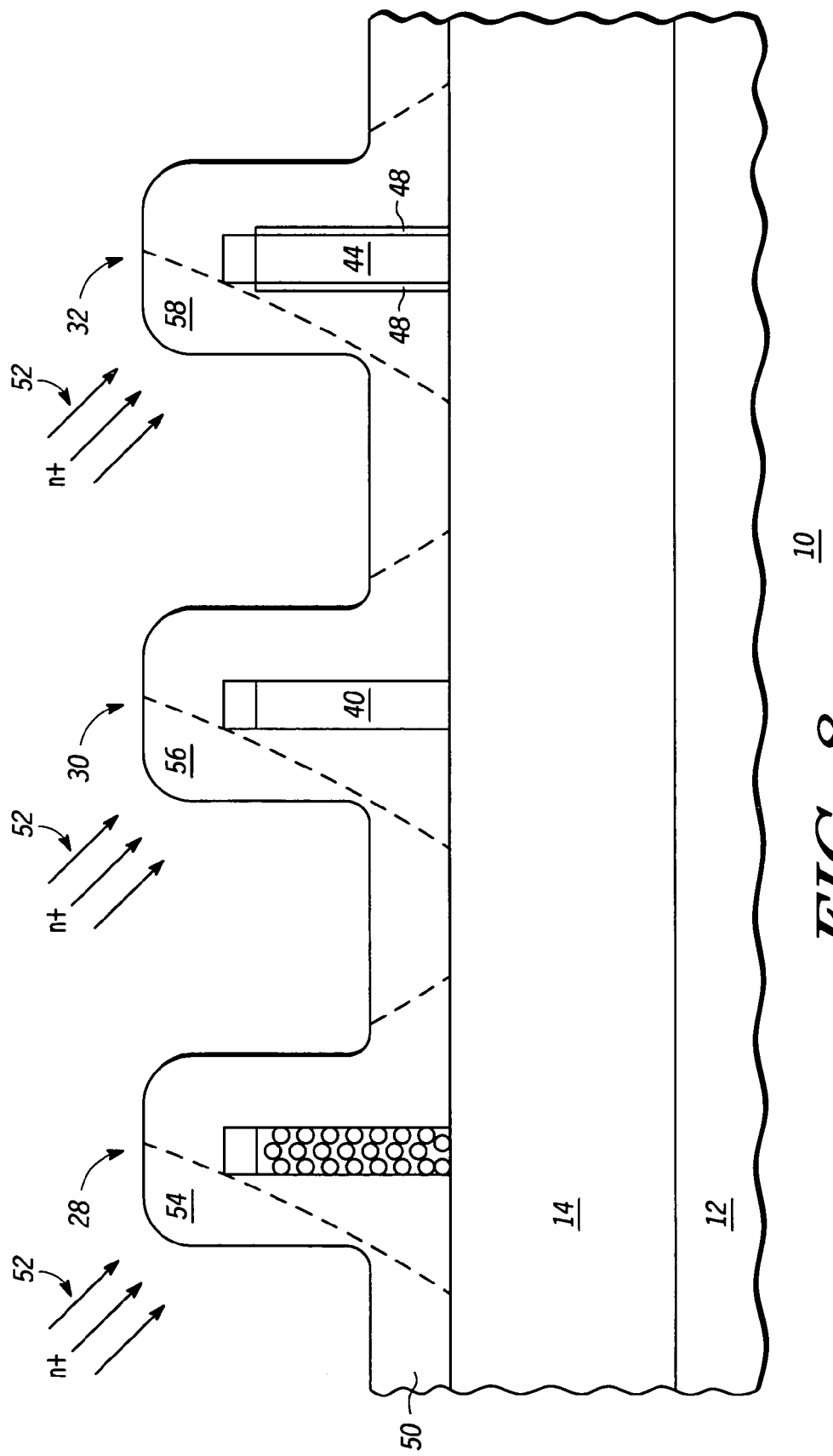
FIG. 8 illustrates the semiconductor device of FIG. 7 after formation of a second semiconductor layer and after performing a first angled implant, in accordance with one embodiment of the present invention.
Figure 9:
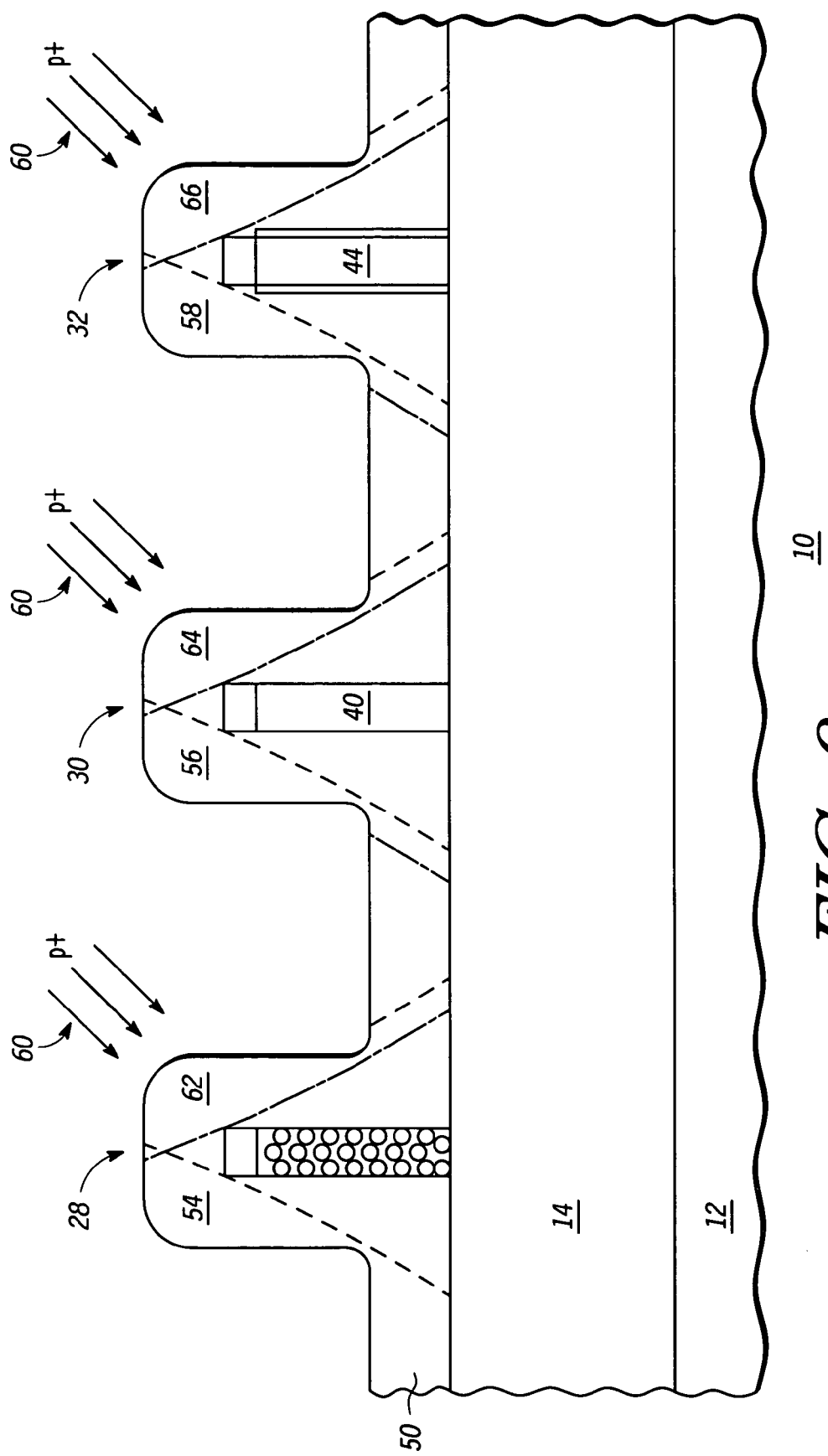
FIG. 9 illustrates the semiconductor device of FIG. 8 after performing a second angled implant, in accordance with one embodiment of the present invention.

FIG. 8 illustrates semiconductor device 10 of FIG. 7 after formation of a second semiconductor layer 50 overlying dielectric layer 14 and fins 28, 30, and 32. Second semiconductor layer 50 may be any type of semiconductor material, such as, for example, silicon or silicon germanium. After formation of second semiconductor layer 50, an angled implant 52 of a first species is performed into second semiconductor layer 50 from a first direction. Angled implant 52 results in regions 54, 56, and 58 doped with the first species. The first species has a first conductivity type, which, in the illustrated embodiment of FIG. 8, is n+. Tn one embodiment, the n+ species may include, for example, phosphorous or arsenic. FIG. 9 illustrates semiconductor device 10 of FIG. 7 after an angled implant 60 of a second species is performed into second semiconductor layer 50 from a second direction, different from the first direction. Angled implant 60 results in the formation of regions 62, 64, and 66 doped with the second species. The second species has a second conductivity type, different from the conductivity type of the first species in FIG. 8, which, in the illustrated embodiment of FIG. 9, is p+. In one embodiment, the p+ species may include, for example, boron. Regions that respectively separate regions 54, 62, regions 56, 64 and regions 58,66 are regions which include both species due to an overlap in angled implants 52 and 60. These regions will be electrically highly resistive compared to those regions in which only one species is implanted. Note that angled implant 52 forms regions of a first species within second semiconductor layer 50 along one side of each of fins 28, 30, and 32 while angled implant 60 forms regions of a second species within second semiconductor layer 50 along an opposite side of each of fins 38, 30, and 32. Note that in alternate embodiments, angled implants 52 and 60 may be performed in the reverse order. Also note that each of angled implants 52 and 60 can be performed using any species, where the first species may be implanted before or after the second species.

In an alternate embodiment, a patterned masking layer (not shown) may be used to mask fin 32 and the portions of second semiconductor layer 50 overlying fin 32 and portions of second semiconductor layer 50 along the sides of fin 32 during angled implants 52 and 60 such that regions 58 and 66 are not formed.

Figure 10:
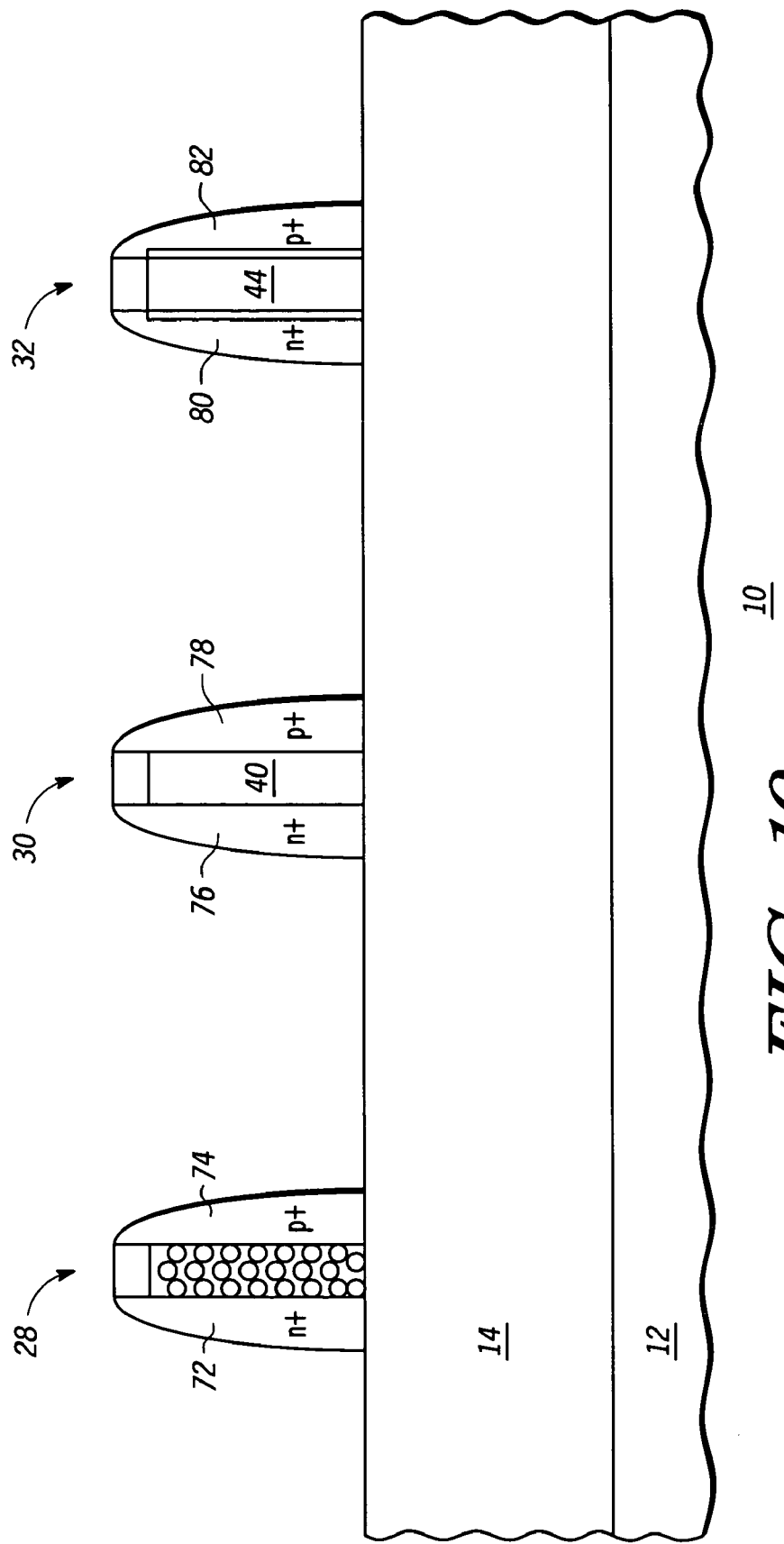
FIG. 10 illustrates the semiconductor device of FIG. 9 after etching of the second semiconductor layer to form conductive electrodes, in accordance with one embodiment of the present invention.

FIG. 10 illustrates semiconductor device 10 of FIG. 9 after an anisotropic etch of second semiconductor layer 50 to form electrodes 72, 74, 76, 78, 80, and 82 (which may also be referred to as conductive electrodes 72, 74, 76, 78, 80, and 82, respectively). This etch isolates the n+ and p+ regions and removes most or all of highly resistive such as portions 68 and 70 of FIG. 9. Electrode 72 is formed along a first side of fin 28 and has a first conductivity type, and electrode 74 is formed along a second side, opposite the first side, of fin 28 and has a second conductivity type, different from the first conductivity type. Each of electrodes 72 and 74 are coupled to the photoelectric region of fin 28, and each of electrodes 72 and 74 and fin 28 are formed on dielectric layer 14. In the illustrated embodiment, electrode 72 is n+ and electrode 74 is p+. Electrode 76 is formed along a first side of fin 30 and has a first conductivity type, and electrode 78 is formed along a second side, opposite the first side, of fin 30 and has a second conductivity type, different from the first conductivity type. Each of electrodes 76 and 78 are coupled to the photoelectric region of fin 30, and each of electrodes 76 and 78 and fin 30 are formed on dielectric layer 14. In the illustrated embodiment, electrode 76 is n+ and electrode 78 is p+. Electrode 80 is formed along a first side of fin 32 and has a first conductivity type, and electrode 82 is formed along a second side, opposite the first side, of fin 32 and has a second conductivity type, different from the first conductivity type. Each of electrodes 80 and 82 are coupled to the semiconductive material of fin 28 and each of electrodes 80 and 82 and fin 32 are formed on dielectric layer 14. In the illustrated embodiment, electrode 80 is n+ and electrode 82 is p+. Therefore, in one embodiment, electrodes 72, 74, 76, 78, 80, and 82 may be formed using a self-aligned spacer etch since they may be formed in a manner similar to sidewall spacers. Note that in an alternate embodiment, this etch is optional and thus, may not be performed.

Figure 11:
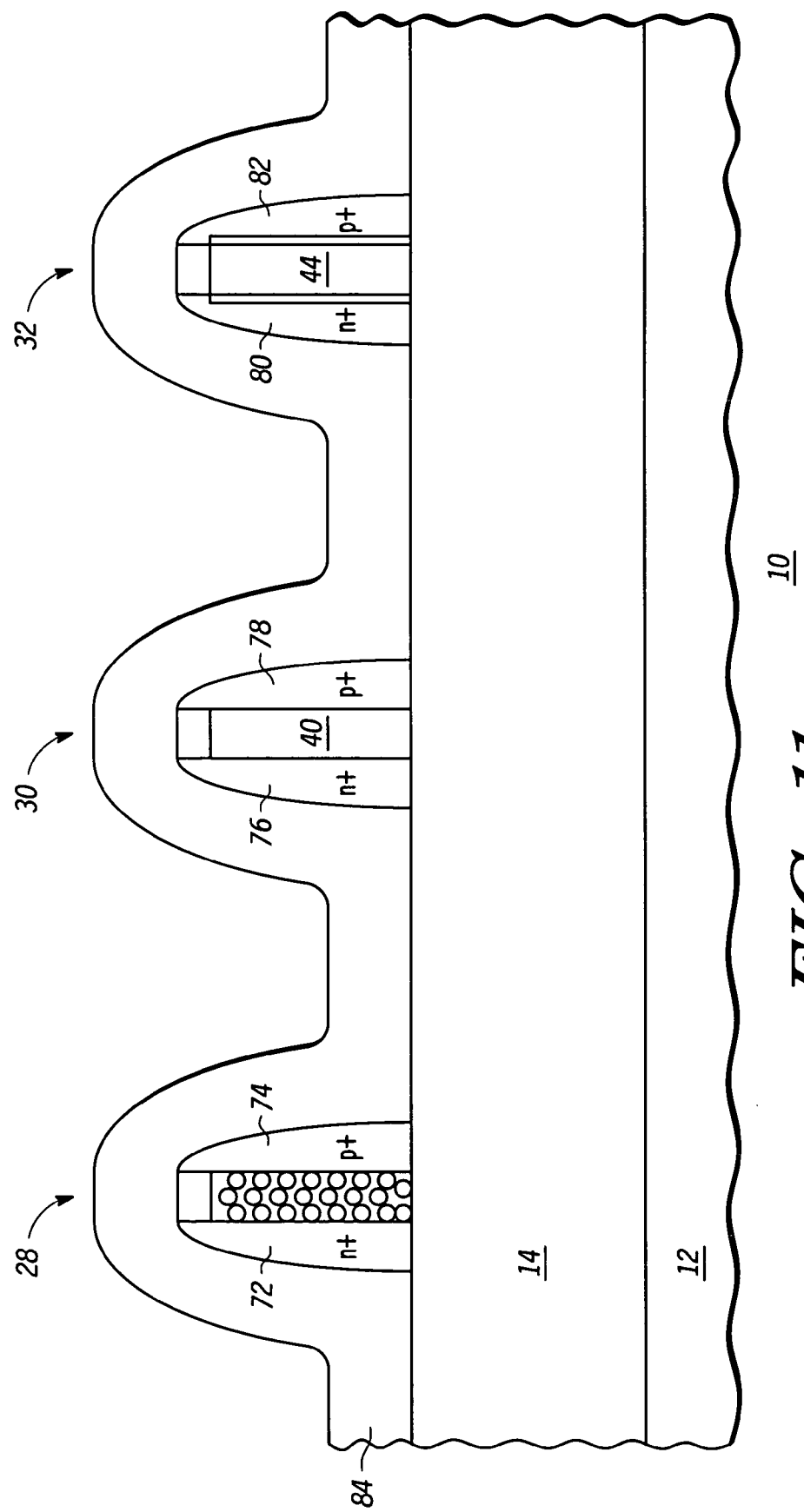
FIG. 11 illustrates the semiconductor device of FIG. 10 after forming a conductive layer, in accordance with one embodiment of the present invention.

FIG. 11 illustrates semiconductor device 10 after formation of a conductive layer 84 overlying dielectric layer 14, fins 28, 30, and 32, and electrodes 72, 74, 76, 78, 80, and 82. In one embodiment, conductive layer 84 may be of any conductive material, such as, for example, polysilicon, tantalum silicon nitride, titanium nitride, silicon germanium, or any combination thereof.

Figure 12:
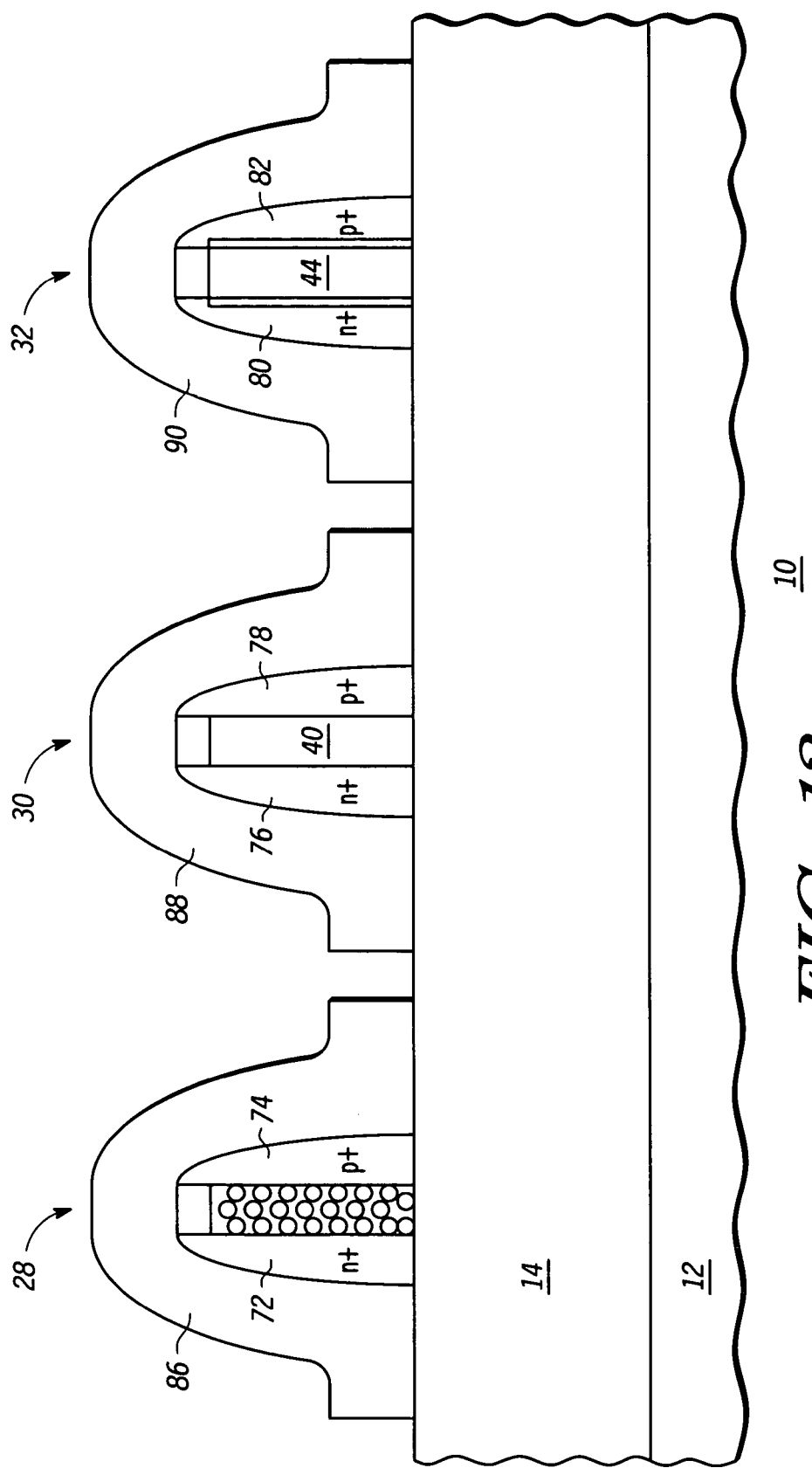
FIG. 12 illustrates the semiconductor device of FIG. 11 after etching portions of the conductive layer, in accordance with one embodiment of the present invention.
Figure 13:
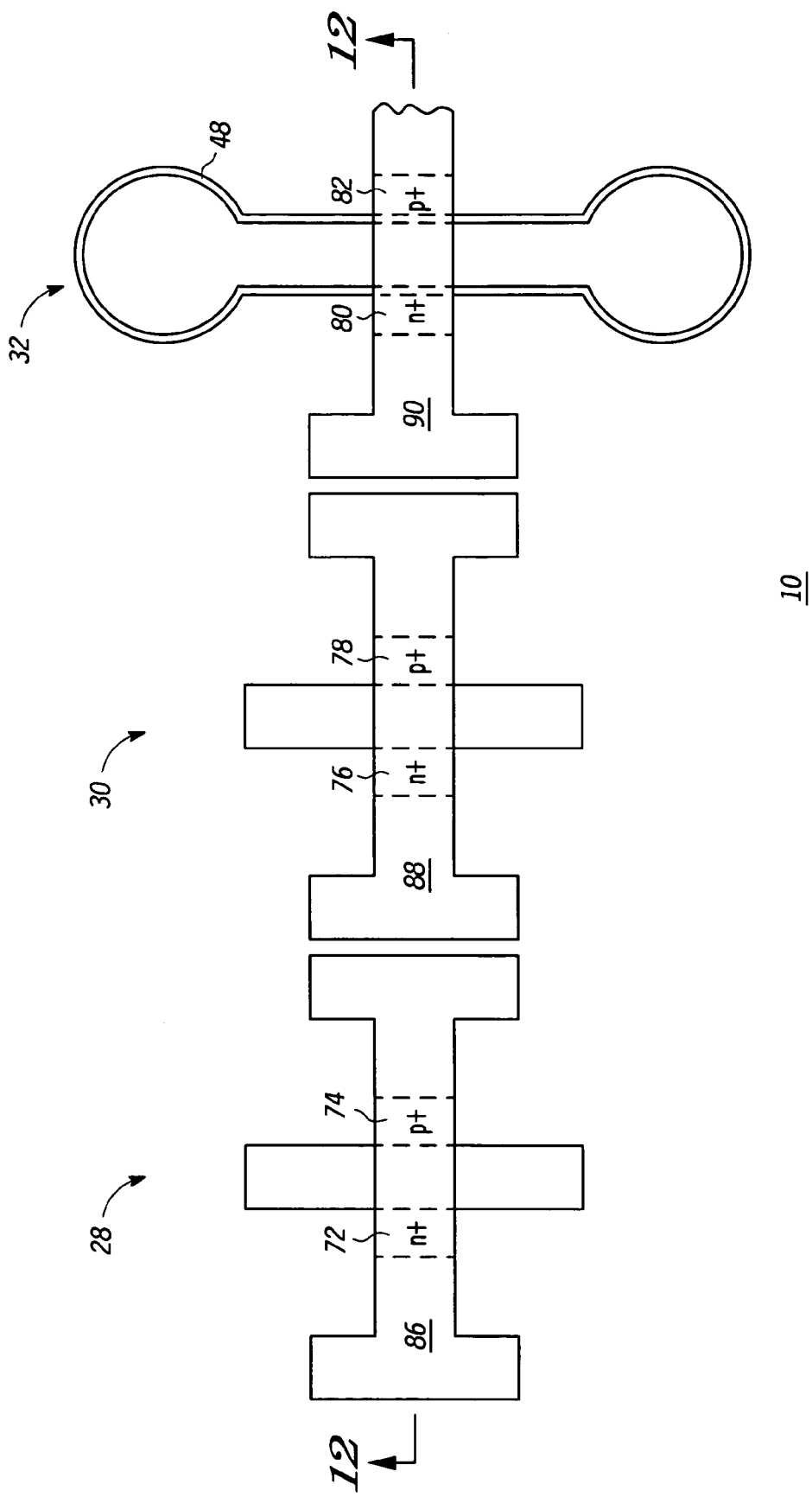
FIG. 13 illustrates a top-down view of the semiconductor device of FIG. 12, in accordance with one embodiment of the present invention.

FIG. 12 illustrates semiconductor device 10 after patterning and etching of conductive layer 84 and electrodes 72, 74, 76, 78, 80, and 82 to form a conductive portion 86 overlying fin 28 and electrodes 72 and 74, a conductive portion 88 overlying fin 30 and electrodes 76 and 78, and a conductive portion 90 overlying fin 32 and electrodes 80 and 82. FIG. 13 illustrates a top down view of semiconductor device 10 of FIG. 12. Note that after the patterning and etching of conductive layer 84 and electrodes 72, 74, 76, 78, 80, and 82, three separate devices (also referred to as elements) are formed, corresponding to each of fins 28, 30, and 32. Note that each of the fins can have any shape. For example, fin 32 may have a dumbbell shape to accommodate source and drain contacts. Conventional photolithographic techniques may be used to pattern and etch conductive layer 84 and electrodes 72, 74, 76, 78, 80, and 82.

Figure 14:
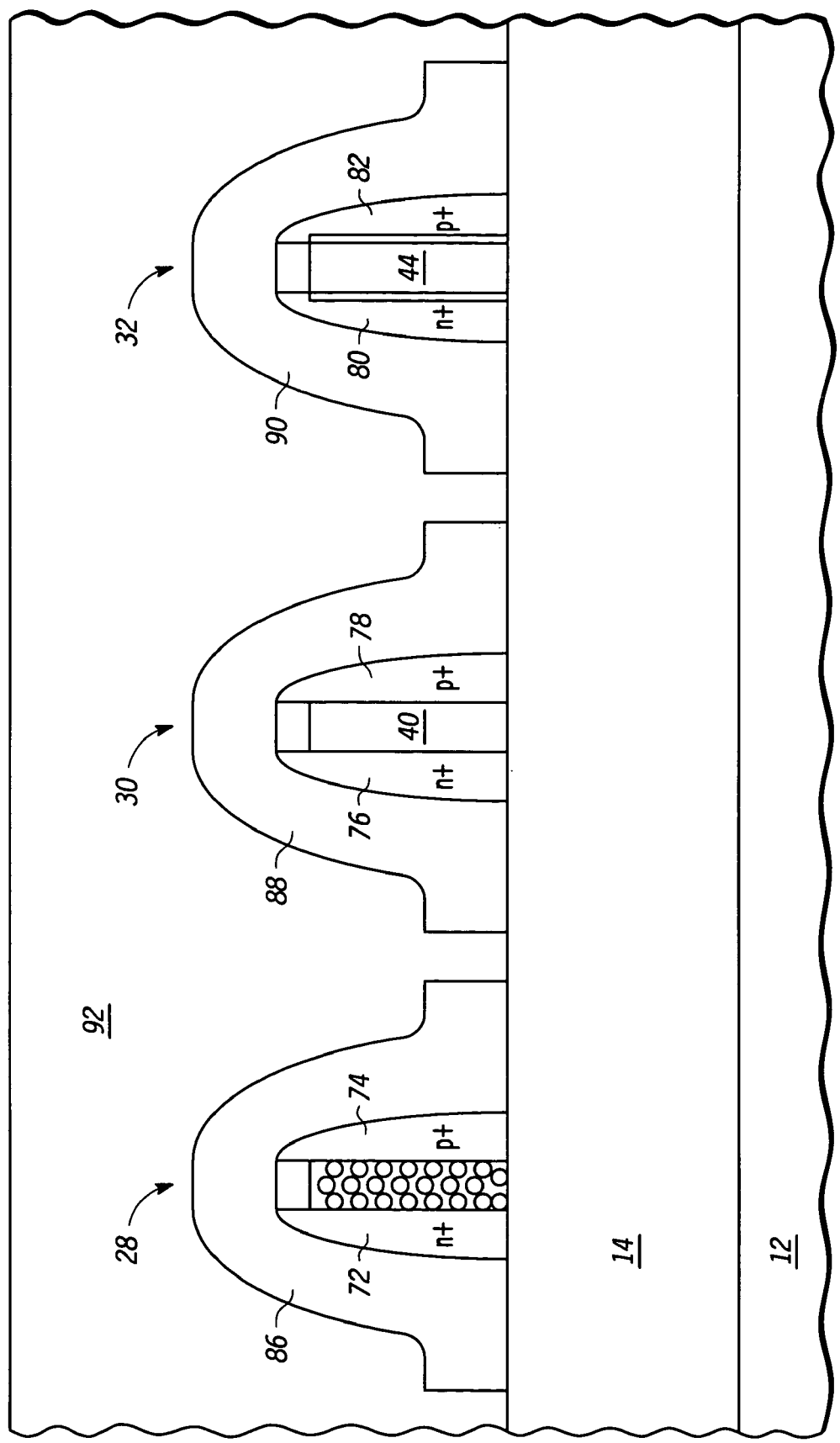
FIG. 14 illustrates the semiconductor device of FIG. 12 after forming a planarization layer, in accordance with one embodiment of the present invention.
Figure 15:
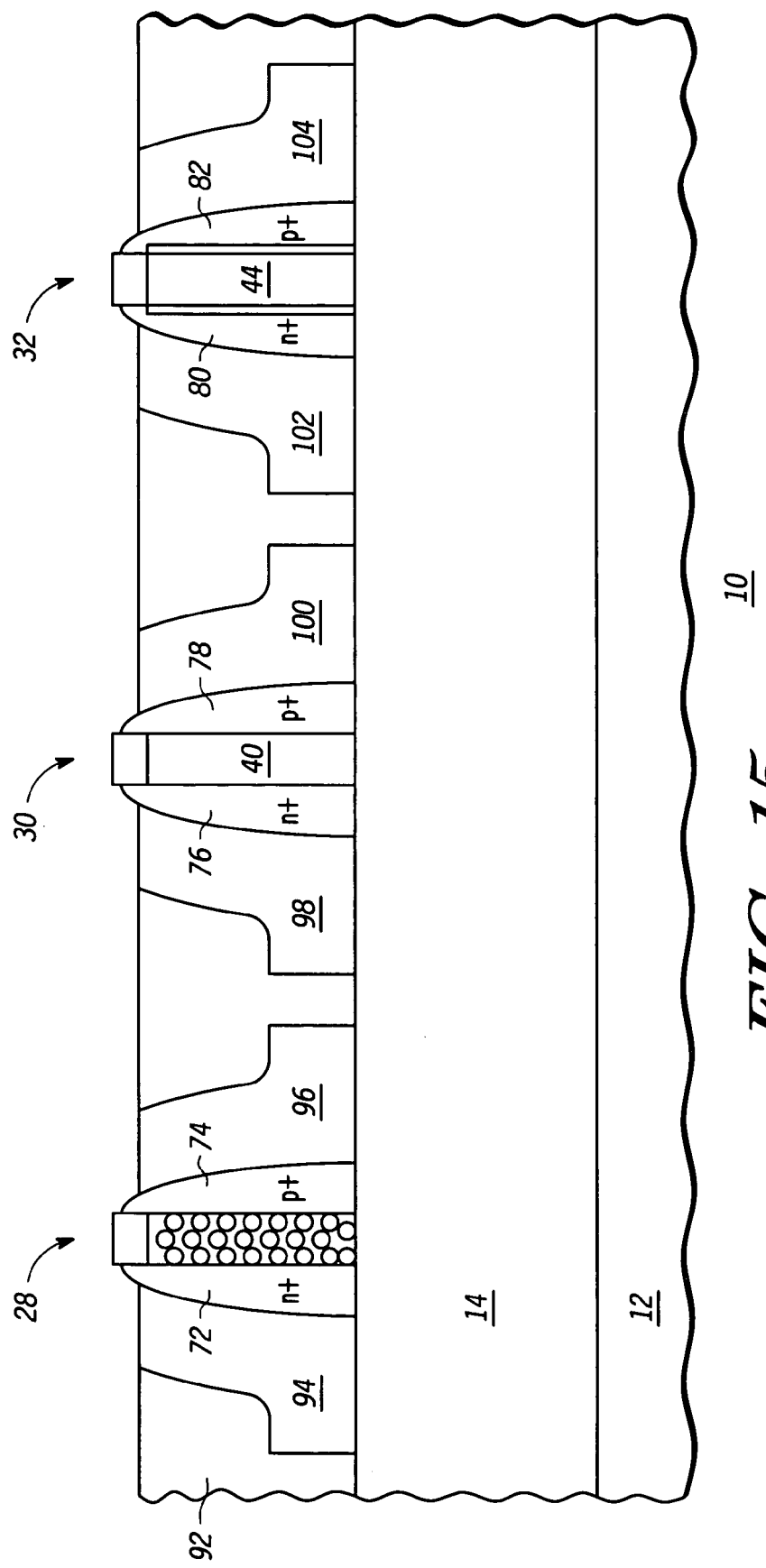
FIG. 15 illustrates the semiconductor device of FIG. 14 after etching portions of the planarization layer and conductive layer, in accordance with one embodiment of the present invention.
Figure 16:
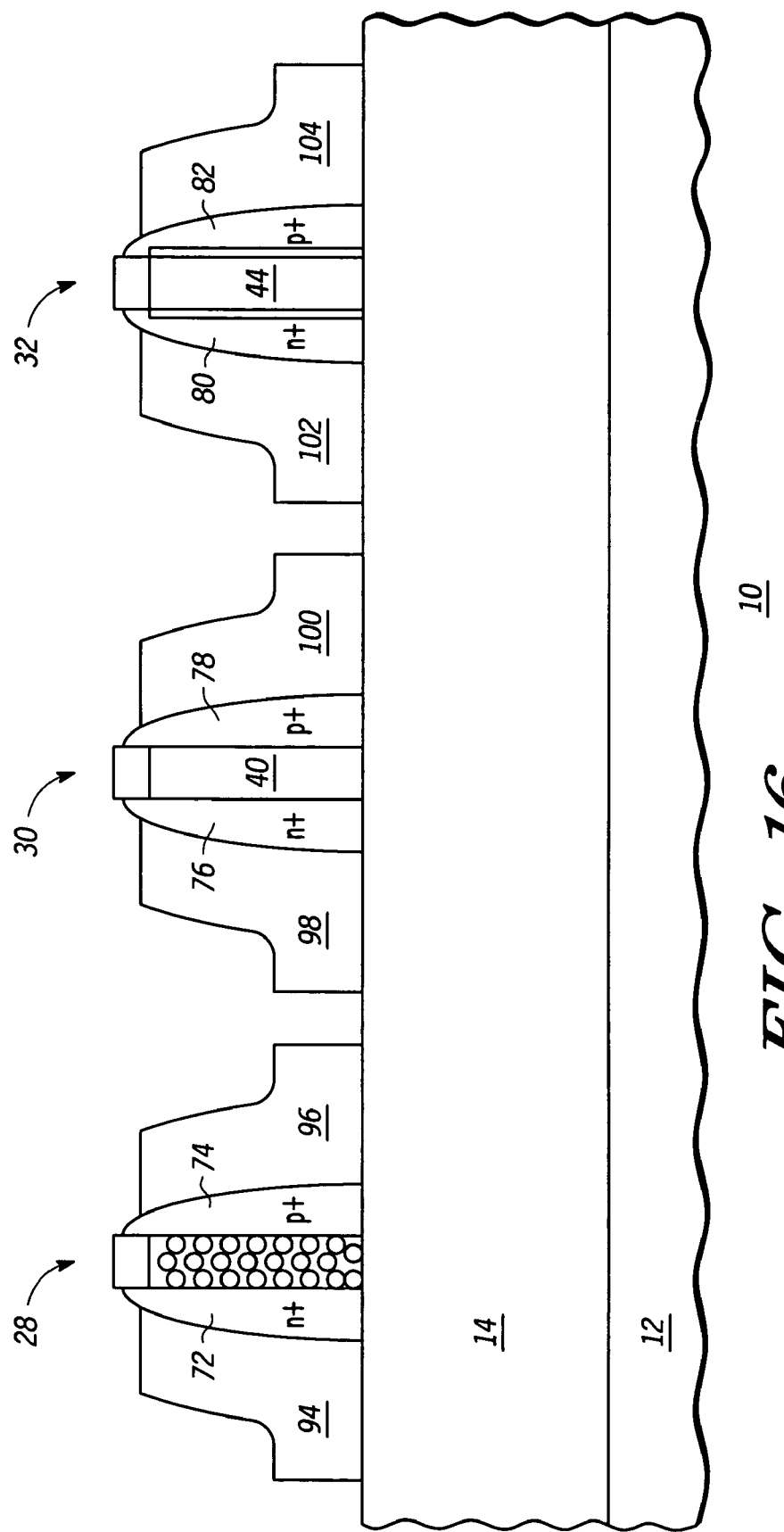
FIG. 16 illustrates the semiconductor device of FIG. 15 after removal of the planarization layer, in accordance with one embodiment of the present invention.

FIG. 14 illustrates semiconductor device 10 of FIG. 12 after formation of a planarization layer 92 over dielectric layer 14 and conductive portions 86, 88, 90. In one embodiment, planarization layer 92 is formed by depositing a photoresist layer. FIG. 15 illustrates semiconductor device 10 of FIG. 14 after planarization of planarization layer 92 to a level which exposes top portions of conductive portions 86, 88, and 90. In the illustrated embodiment, planarization layer 92 is etched to expose the top portions of conductive portions 86, 88, and 90, and afterwards, the top portions of conductive portions 86, 88, and 90 are removed, thus resulting in conductive portions 94, 96, 98, 100, 102, and 104, all isolated from each other. Conductive portions 94 and 96 are located on opposite sides of fin 28 and are isolated from each other, conductive portions 98 and 100 are located on opposite sides of fin 30 and are isolated from each other, and conductive portions 102 and 104 are located on opposite sides of fin 32 and are isolated from each other. In an alternate embodiment, conductive portion 90 may not be etched to form conductive portions 102 and 104 such that the resulting device will not include isolated gates. Note that during the etching of conductive portions 86, 88, and 90, portions of electrodes 72, 74, 76, 78, 80, and 82 may also be removed. FIG. 16 illustrates semiconductor device 10 of FIG. 15 after removal of planarization layer 92. Conventional etch and cleaning techniques may be used to remove planarization layer 92.

Figure 17:
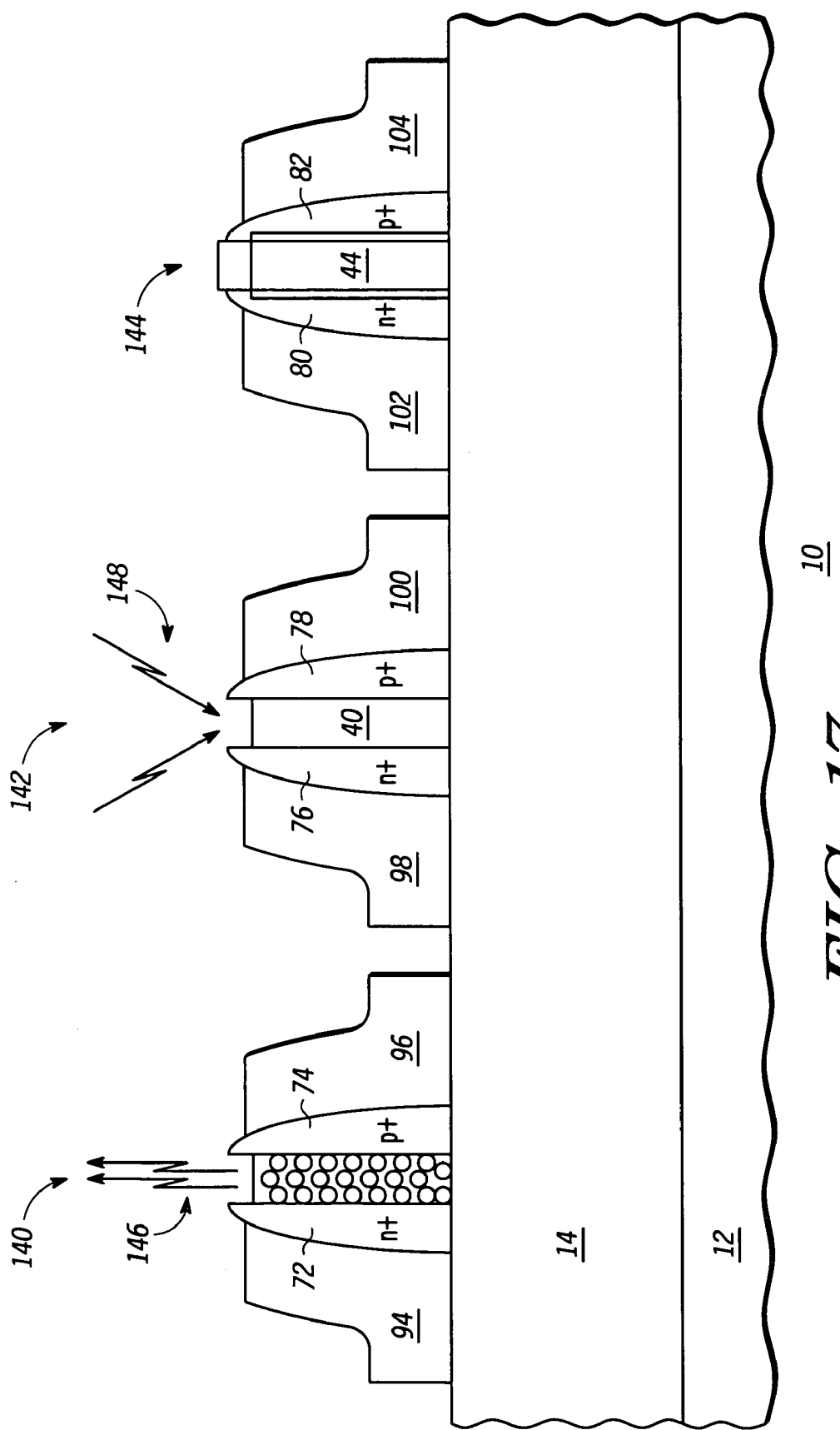
FIG. 17 illustrates the semiconductor device of FIG. 16 having three different substantially completed elements, in accordance with one embodiment of the present invention.

Therefore, as illustrated in FIG. 17, three devices or elements 140, 142, and 144 are formed. In the illustrated embodiment, elements 140 and 142 are vertical optical devices and element 144 is a vertical field-effect transistor. In the illustrated embodiment, element 140, formed from fin 28, is a light emitting element, such as, for example, an LED or a laser. In the illustrated embodiment, element 142, formed from fin 30, is a light detecting element, such as, for example, a photo sensor. In the illustrated embodiment, element 144, formed from fin 32, is a MOSFET. Therefore, one embodiment of the present invention may allow for the integration of different types of elements or devices, including both optical semiconductor elements or devices and other types of semiconductor elements or devices. In alternate embodiments, only one or two types of elements may be formed. For example, in one embodiment, an array of light emitting elements such as element 144 may be formed without including elements such as elements 142 and 144. Note that in the illustrated embodiment, the dielectric portions overlying the photoelectric regions of fins 28 and 30 are removed, but in alternate embodiments, they may not be removed.

Element 140 may be used to emit light 146, where light refers to photons that are emitted in a wide range of wavelengths. For example, light may include infrared, visible, and ultraviolet light. In element 140, the n+ region operates as an electron source region and the p+ region operates as a hole source region. Thus, the recombination of electron and holes in the nanoclusters (or, in an alternate embodiment, in the porous semiconductor material, if used in place of the nanoclusters) emits photons. For example, in one embodiment, a voltage applied to electrodes 72 and 74 causes the recombination of electron and holes in the photoelectric region of element 140, thus causing the photoelectric region to emit photons. In one embodiment, the sides of fin 28 may be varied (such as, for example, by creating sidewalls that make cavities which enable a laser or by angling the sides of opening 20 in FIG. 2) to result in coherent light waves, i.e. a laser. Although element 140 is illustrated as emitting light from a top portion of fin 28, element 140 may emit light in any direction along the sides of fin 28 and in a plane vertical to the plane in which the figure is drawn. Therefore, element 140 includes a photoelectric region in contact with electrodes 72 and 74 of different conductivity types which allows element 140 to emit light.

Element 142 may be used to sense or detect light. In element 142, light 148 is incident on the p-i-n junction formed by electrode 78, fin 30 (having an intrinsic semiconductor photoelectric region), and electrode 80. When light 148 is incident upon the p-i-n junction, a potential difference can be sensed between electrodes 76 and 78. (For example, when sensing light, a conductivity of the photoelectric region changes in response to changes in light intensity.) Therefore, element 142 includes a photoelectric region in contact with electrodes 72 and 74 of different conductivity types which allows element 142 to detect or sense light.

Figure 18:
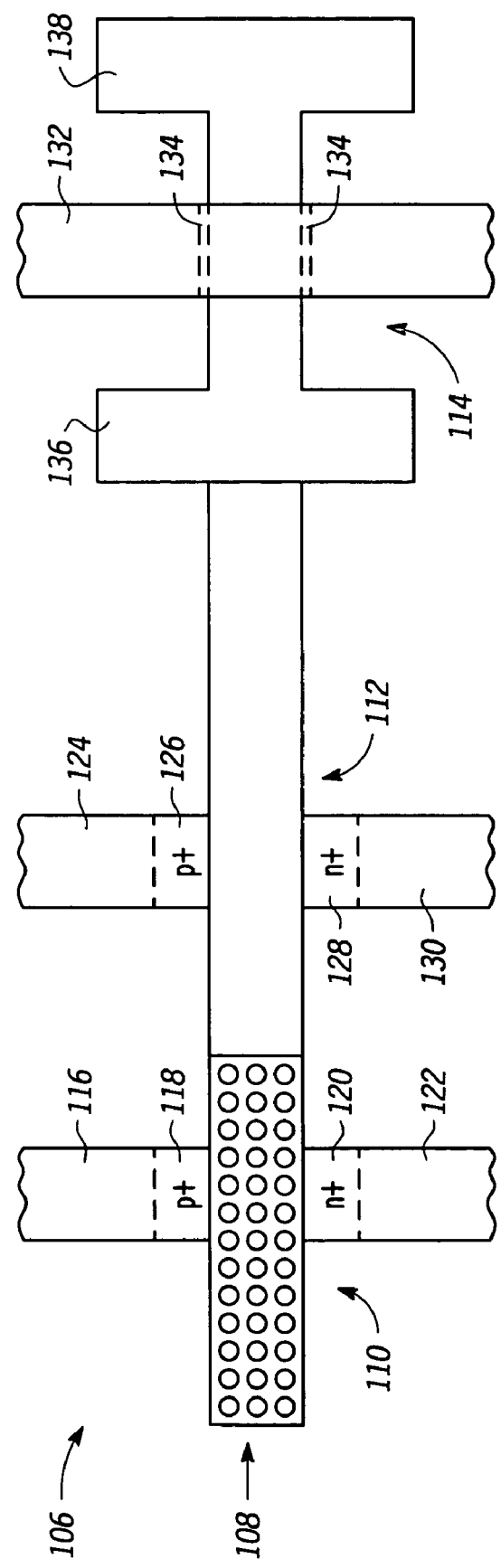
FIG. 18 illustrates a top-down view of a semiconductor device having three semiconductor elements, in accordance with an alternate embodiment of the present invention.

FIG. 18 illustrates a top down view 106 of an alternate embodiment in which all elements are integrated such that each of the fins of the elements are linearly coupled. For example, as illustrated in FIG. 18, a fin 108 may be used to form different types of elements, such as elements 140, 142, and 144 of FIG. 17. In this embodiment, a first portion 110 of fin 108 may be formed having nanoclusters, in a manner similar to the formation of nanocluster portion 36 of FIG. 6, where this first portion corresponds to an element 146. Alternatively, first portion 110 may be formed of a porous semiconductor material. A second portion 112 of fin 108 may be formed of intrinsic semiconductor material where this second portion corresponds to an element 148, and a third portion 114 of fin 108 may be formed of doped or undoped semiconductor material where this third portion corresponds to an element 150. In the illustrated embodiment, each of first portion 110, second portion 112, and third portion 114 are all linearly coupled.

Each of the first, second, and third portions of fin 108 may therefore correspond to different types of elements or devices. For example, element 146 may be a light emitting element having electrodes 118 and 120 and isolated conductive portions 116 and 122. Note that electrodes 118 and 120 and isolated conductive portions 116 and 122 are similar to electrodes 74 and 72 and isolated conductive portions 96 and 94, respectively. Therefore, element 146 operates similar to element 140. Element 148 may be a light detecting element having electrodes 126 and 128 and isolated conductive portions 124 and 130. Note that electrodes 126 and 128 and isolated conductive portions 124 and 130 are similar to electrodes 78 and 76 and isolated conductive portions 100 and 98, respectively. Therefore, element 148 operates similar to element 142. Element 150 may be a MOSFET having source/drain regions 136 and 138, and a gate region 132. Note that element 150 includes an oxide 134 along sides of third portion 114 of fin 108 underlying gate region 132. Note that in this embodiment, gate region 132 is not separated into two isolated portions. This can be done using conventional masking techniques such as using a nitride or oxide hard mask.

By now it should be appreciated that there has been provided improved optical semiconductor devices or elements for emitting and detecting light. Also provided is a method for integrating these types of devices with each other and with other types of semiconductor devices such as MOSFETs or vertical MOSFETs. The integration of these types of devices may allow for a wide range of applications, such as, for example, opto-couplers, displays, cameras, and the electronic circuitry to control them. The optical devices described herein may also be used to form photocells. Also note that each of the types of devices or elements may be independently used, as desired. Note that use of vertical optical devices (such as those illustrated in FIG. 17) may allow for reduced surface area as compared to prior art planar devices which are laterally formed within a semiconductor layer. Also, the sides of the photoelectric region of a vertical optical device may allow for the ability to use more of the photo emitting or detecting dimensions as compared to prior art devices.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

What is claimed is:

1. A method for forming a semiconductor optical device comprising:
prov256iding an insulating layer having a surface;
forming a light emitting fin region on the surface of the insulating layer that has a height that is greater than a width thereof;
forming a conformal semiconductor layer overlying and adjacent the light emitting fin region;
doping the conformal semiconductor layer using two angled implants of opposite conductivity type and respectively angled to opposite sides of the light emitting fin region;
partially removing the conformal semiconductor layer adjacent the light emitting fin region and removing the conformal semiconductor layer above the light emitting fin region, the partially removing leaving a remainder thereof which is used to form a first light emitting fin sidewall electrode having a first conductivity type on the insulating layer and contacting a first side of the light emitting fin region, and form a second light emitting fin sidewall electrode having a second conductivity type on the insulating layer and contacting a second side of the light emitting fin region, the second side opposite the first side.

2. The method of claim 1, wherein the light emitting fin region emits photons when a voltage is applied to the first and second light emitting fin sidewall electrodes.

3. The method of claim 1, wherein the light emitting fin region comprises a plurality of nanoclusters embedded in an insulating material.

4. The method of claim 1, wherein providing the insulating layer comprises forming the insulating layer on a semiconductor substrate.

5. The method of claim 1, wherein forming the light emitting fin region comprises forming the light emitting fin region from at least one of cadmium selenide or zinc sulfide.

6. The method of claim 1, wherein the first conductivity type is n+ and the second conductivity type is p+.

7. The method of claim 1, wherein forming the first light emitting fin sidewall electrode comprises using a first angled implant, from a first direction, to provide the first conductivity type, forming the second light emitting fin sidewall electrode using a second angled implant from a second direction, to provide the second conductivity type, said light emitting fin region having a height sufficient to block doping of each light emitting fin sidewall electrode from either the first direction or the second direction.

8. The method of claim 7, further comprising forming and patterning a first conductive contact adjacent to and in direct contact with the first light emitting fin sidewall electrode, and forming and patterning a second conductive contact adjacent to and in direct contact with the second light emitting fin sidewall electrode.

9. The method of claim 1, wherein forming the first light emitting fin sidewall electrode and the second light emitting fin sidewall electrode are formed using a self-aligned spacer etch.

10. The method of claim 1, wherein forming the light emitting fin region comprises embedding a plurality of nanoclusters in an oxide, wherein a density of the plurality of nanoclusters, and a size of each of the plurality of nanoclusters varies throughout the oxide.

11. A method comprising:
providing a supporting layer;
forming a first semiconductor layer overlying the supporting layer;
etching an opening in the first semiconductor layer where a light emitting device is desired;
forming a layer of light emitting material overlying the first semiconductor layer and the opening;
forming a dielectric layer overlying the layer of light emitting material;
providing a patterned masking layer overlying the opening and removing exposed material to form a fin structure comprising light emitting material on the supporting layer, the fin structure being taller than its width;
forming a second semiconductor layer overlying and adjacent the fin structure;
angle implanting the second semiconductor layer from two opposing angles with opposite conductivity implants; and
removing the second semiconductor layer from above the fin structure to form a first electrode from the second semiconductor layer, the first electrode being on a first sidewall of the fin structure, said removing also forming a second electrode from the second semiconductor layer, the second electrode being of opposite conductivity type from the first electrode and being on a second sidewall of the fin structure opposite from the first sidewall.

12. The method of claim 11 comprising:
biasing the first electrode and the second electrode to emit light from the light emitting material at a top of the fin structure.

13. A method comprising:
providing a base layer;
forming a first semiconductor layer overlying the base layer;
etching an opening in the first semiconductor layer where a light emitting device is desired;
forming a layer of light emitting nanoclusters overlying the first semiconductor layer and the opening;
forming a dielectric layer overlying the layer of light emitting nanoclusters;
providing a patterned masking layer overlying the opening and removing exposed portions of the dielectric layer and the layer of light emitting nanoclusters to form a fin structure comprising light emitting nanoclusters on the base layer, the fin structure being taller than its width;
forming a second semiconductor layer overlying and adjacent the fin structure;
angle implanting the second semiconductor layer from two opposing angles with opposite conductivity implants; and
removing the second semiconductor layer from above the fin structure to form a first electrode from the second semiconductor layer, the first electrode being on a first sidewall of the fin structure, said removing also forming a second electrode from the second semiconductor layer, the second electrode being of opposite conductivity type from the first electrode and being on a second sidewall of the fin structure opposite from the first sidewall.

* * * * *